(12) United States Patent
Seo et al.

(10) Patent No.: US 7,768,141 B2
(45) Date of Patent: Aug. 3, 2010

(54) DICING DIE ATTACHMENT FILM AND METHOD FOR PACKAGING SEMICONDUCTOR USING SAME

(75) Inventors: Joon-Mo Seo, Suwon-si (KR); Byoung-Un Kang, Yongin-si (KR); Kyung-Tae Wi, Ayang-si (KR); Jae-Hoon Kim, Seoul (KR); Tae-Hyun Sung, Seoul (KR); Soon-Young Hyun, Gyeonggi-do (KR); Byoung-Kwang Lee, Gyeonggi-do (KR); Chan-Young Choi, Gyeonggi-do (KR)

(73) Assignee: LG Innotek Co., Ltd., Seoul (KR)

( * ) Notice: Subject to any disclaimer, the term of this patent is extended or adjusted under 35 U.S.C. 154(b) by 46 days.

(21) Appl. No.: 12/279,519

(22) PCT Filed: Feb. 14, 2007

(86) PCT No.: PCT/KR2007/000789
§ 371 (c)(1), (2), (4) Date: Dec. 5, 2008

(87) PCT Pub. No.: WO2007/094612
PCT Pub. Date: Aug. 23, 2007

(65) Prior Publication Data
US 2009/0091044 A1 Apr. 9, 2009

(30) Foreign Application Priority Data
Feb. 14, 2006 (KR) .................... 10-2006-0014379
Feb. 14, 2007 (KR) .................... 10-2007-0015219

(51) Int. Cl.
*H01L 23/29* (2006.01)

(52) U.S. Cl. .......................... 257/790; 257/E23.117; 438/114; 438/465

(58) Field of Classification Search ............... 438/114, 438/465; 257/790, E23.117
See application file for complete search history.

(56) References Cited

U.S. PATENT DOCUMENTS

| 6,297,072 B1 * | 10/2001 | Tilmans et al. ............. 438/106 |
| 6,342,434 B1 * | 1/2002 | Miyamoto et al. .......... 438/464 |
| 6,444,310 B1 | 9/2002 | Senoo et al. |
| 6,784,024 B2 * | 8/2004 | Jiang ......................... 438/118 |

FOREIGN PATENT DOCUMENTS

| JP | 2003-142505 | 5/2003 |
| JP | 2003-268327 | 9/2003 |
| KR | 10-0447014 | 8/2004 |
| KR | 10-2005-0095199 | 9/2005 |

OTHER PUBLICATIONS

International Search Report and Written Opinion of the International Searching Authority for International Application No. PCT/KR2007/000789 dated May 17, 2007.

* cited by examiner

*Primary Examiner*—Chandra Chaudhari
(74) *Attorney, Agent, or Firm*—Stroock & Stroock & Lavan LLP (57) ABSTRACT

A dicing die attachment film includes a die attachment layer attached to one surface of a semiconductor wafer; a dicing film layer attached to a dicing die that is used for cutting the semi-conductor wafer into die units; and an intermediate layer laminated between the die attachment layer and the dicing film layer. The intermediate layer has a modulus of 100 to 3000 MPa, which is greater than a modulus of the die attachment layer and the dicing film layer.

14 Claims, 7 Drawing Sheets

| | EMBODIMENTS | | | COMPARATIVE EXAMPLES | | | | | | |
|---|---|---|---|---|---|---|---|---|---|---|
| | 1 | 2 | 3 | 1 | 2 | 3 | 4 | 5 | 6 | 7 |
| Kind of DA resin | | | | | epoxy | | | | | |
| Kind of DF resin | | | | | polyethylene | | | | | |
| Kind of intermediate layer resin | PET | OPP (oriented polypropylene) | HDPE | PE | Glass | PET | PET | PET | PET | |
| DA modulus [MPa] | 50 | 40 | 40 | 30 | 50 | 30 | 30 | 30 | 30 | 40 |
| DF modulus [MPa] | 25 | 40 | 80 | 40 | 25 | 40 | 40 | 40 | 40 | 25 |
| Modulus of intermediate layer [MPa] | 1200 | 250 | 200 | 30 | 3600 | 1200 | 1200 | 1200 | 1200 | |
| Change rate of storage modulus of intermediate layer | 0.2 | 0.01 | 0.005 | 0 | 1 | 0.2 | 0.2 | 0.2 | 0.2 | |
| Elongation of intermediate layer [%] | 100 | 25 | 200 | 1200 | less than 1 | 100 | 100 | 110 | 100 | |
| Thickness of intermediate layer [μm] | 50 | 70 | 80 | 80 | 50 | 50 | 50 | 150 | 50 | |
| Adhesive force of DA & intermediate layer [gf/in] | 5 | 10 | 10 | 10 | 50 | 150 | 1 | 10 | 250 | |
| Adhesive force of intermediate layer & DF [gf/in] | 400 | 250 | 250 | 250 | 400 | 250 | 250 | 250 | 25 | |

Fig. 7

|  | EMBODIMENTS ||| COMPARATIVE EXAMPLES |||||||
|---|---|---|---|---|---|---|---|---|---|---|
|  | 1 | 2 | 3 | 1 | 2 | 3 | 4 | 5 | 6 | 7 |
| Generation of burr | Good | Good | Good | Bad | Good | Good | Good | Good | Good | Bad |
| Die flying | Good | Good | Good | Good | Good | Good | Good | Good | Good | Good |
| Expandibility in Expanding process | Good | Good | Good | Good | Bad | Good | Bad | Good | Good | Good |
| Bending of dicing die attachment film in Picking-up process | Good | Good | Good | Good | Bad | Good | Good | Bad | Good | Good |
| Easiness of die picking-up | Good | Good | Good | Good | Bad | Bad | Good | Bad | Bad | Good |

DICING DIE ATTACHMENT FILM AND METHOD FOR PACKAGING SEMICONDUCTOR USING SAME

CROSS-REFERENCE TO RELATED APPLICATIONS

This application is a national stage application under 35 U.S.C. 371 based on and claiming the benefit of International Application Serial No. PCT/KR2007/000789 filed on Feb. 14, 2007 and the benefit of priority from Korean Application No. 10-2006-0014379 filed on Feb. 14, 2006 and Korean Application No. 10-2007-0015219 filed on Feb. 14, 2007 the entire contents of each of which are incorporated herein by reference.

TECHNICAL FIELD

The present invention relates to a dicing die attachment film and a method for packaging a semiconductor using the same, and more particularly to a dicing die attachment film configured to allow easy picking-up and prevent generation of burr during the dicing process, and a method for packaging a semiconductor using the same.

BACKGROUND ART

Generally, a dicing die attachment film used in a semiconductor packaging process is configured in two-layer structure having a die attachment film and a dicing film, and UV ray is irradiated thereto after dicing and before die picking-up so as to control an adhesive force between the die attachment film and the dicing film. This conventional dicing die attachment film controls an adhesive force using UV ray, which yields a simple lamination structure, but the irradiated UV ray may damage a semiconductor chip, resulting in inferior products.

Meanwhile, Korean Laid-open Patent Publication No. 2005-95199 discloses a dicing die attachment film, which may pick up a die and a die attachment film without using UV irradiation. In this document, a contractible release film is provided between the die attachment film and the dicing film to control an adhesive force, so the adhesive force may be controlled without UV irradiation.

Figure 1:
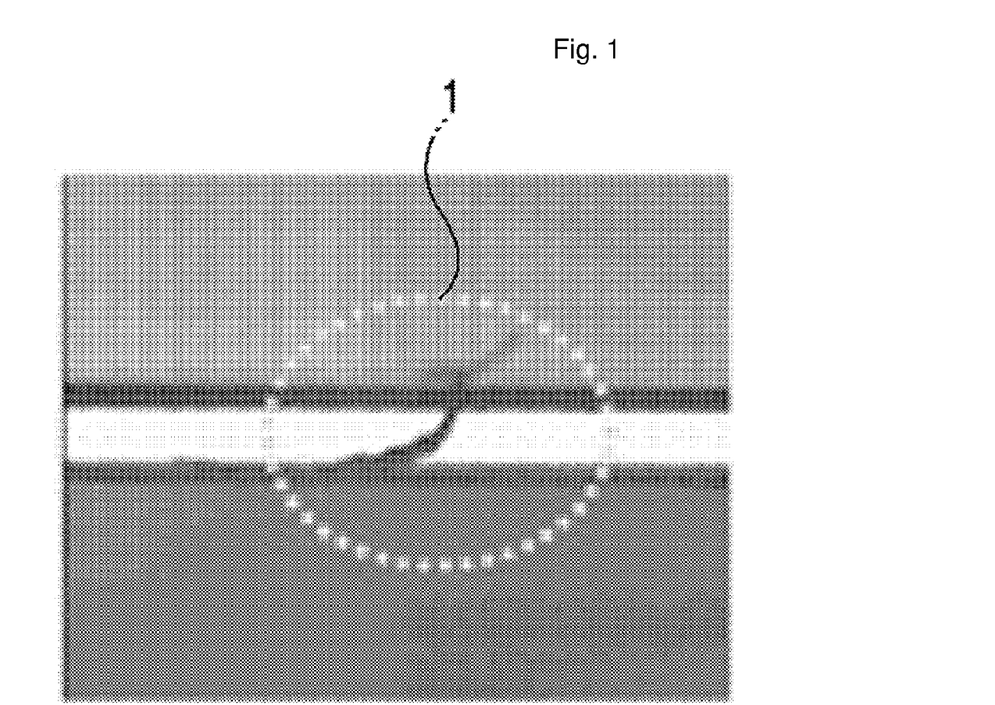
FIGS. 1 and 2 are photographs showing burr generated in a conventional dicing die attachment film.
Figure 2:
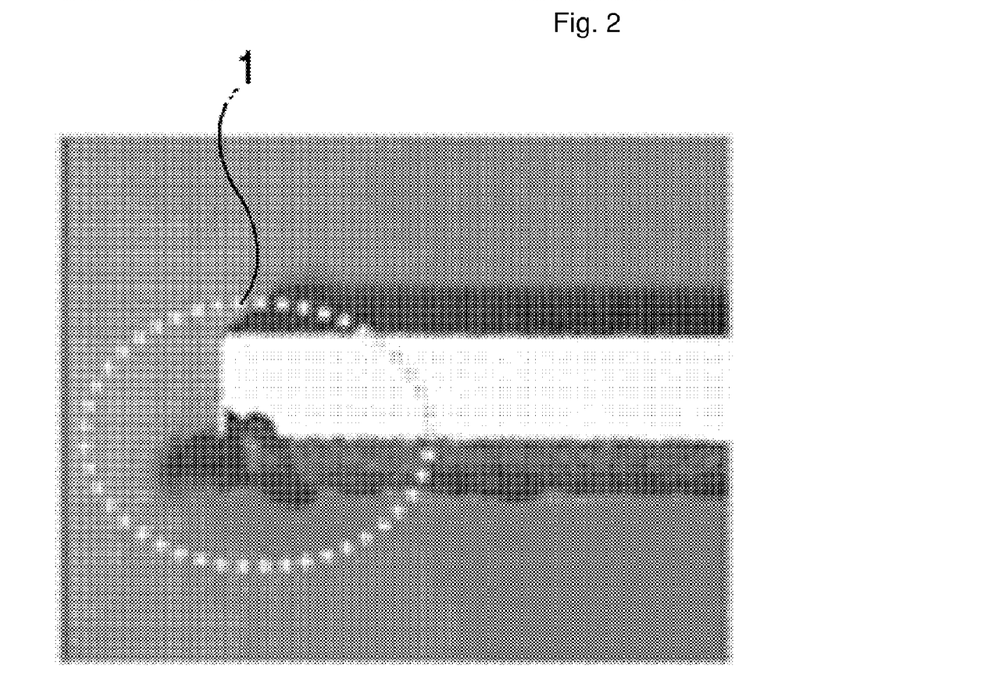
Figure 3:
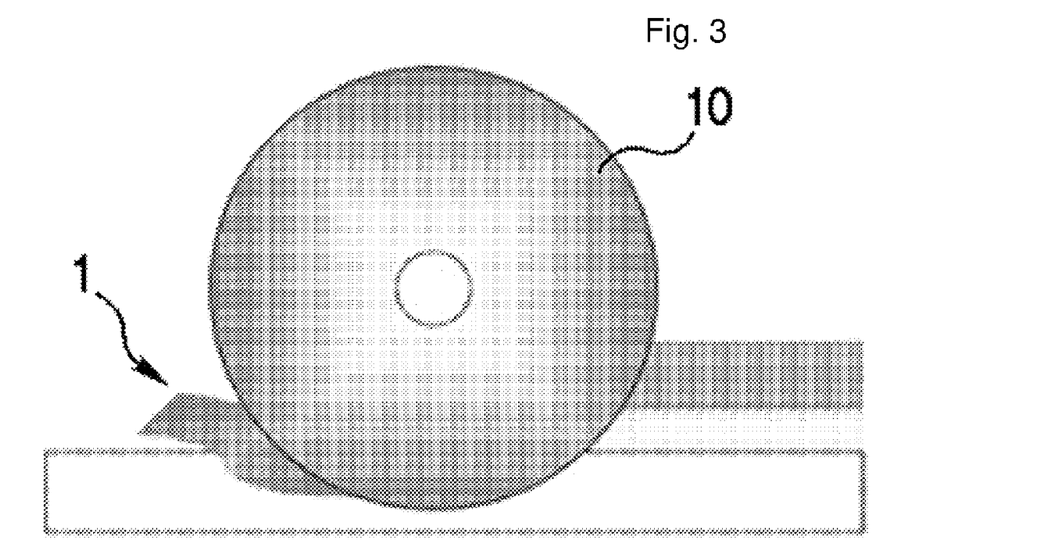
FIG. 3 is a schematic diagram illustrating a process of removing burr using a diamond blade.

However, the above document may also cause generation of burr 1 (see FIGS. 1 and 2) during the dicing process like the conventional attachment film, and thus burr 1 should be removed using a diamond blade 10 (see FIG. 3).

DISCLOSURE OF INVENTION

Technical Problem

The present invention is designed in consideration of the above problems, and therefore it is an object of the invention to provide a dicing die attachment film configured to easily pick up a die and a die attachment film during a picking-up process together with preventing generation of burr and die flying during a dicing process, and a method for packaging a semiconductor using the same.

Technical Solution

In one aspect of the present invention, there is provided a dicing die attachment film, which includes a die attachment layer attached to one surface of a semiconductor wafer; a dicing film layer attached to a dicing die that is used for cutting the semiconductor wafer into die units; and an intermediate layer laminated between the die attachment layer and the dicing film layer, wherein the intermediate layer has a modulus of 100 to 3000 MPa, which is greater than a modulus of the die attachment layer and the dicing film layer.

Preferably, a change rate of a storage modulus of the intermediate layer (a storage modulus at 120° C./a storage modulus at 25° C.) is 0.001 to 1.

Also preferably, the intermediate layer has an elongation of 10 to 700%.

In addition, the intermediate layer preferably has a thickness of 5 to 100 μm.

Preferably, an adhesive force between the die attachment layer and the intermediate layer is lower than an adhesive force between the intermediate layer and the dicing film layer.

Also preferably, an adhesive force between the die attachment layer and the intermediate layer is 2 gf/in to 100 gf/in.

The intermediate layer may be made of polyethylene terephthalate (PET) or polyethylene-2,6-naphthaledicarboxylate (PEN).

Preferably, an adhesive layer may be provided between the intermediate layer and the dicing film layer.

Preferably, the die attachment layer is made of polyimide-based resin or epoxy-based resin.

Also preferably, the dicing film layer is made of polyolefin-based resin.

In another aspect of the present invention, there is also provided a method for packaging a semiconductor, which includes (a) preparing a dicing die attachment film that includes a die attachment layer attached to one surface of a semiconductor wafer, a dicing film layer attached to a dicing die that is used for cutting the semiconductor wafer into die units, and an intermediate layer laminated between the die attachment layer and the dicing film layer, the intermediate layer having a modulus of 100 to 3000 MPa, which is greater than a modulus of the die attachment layer and the dicing film layer; (b) attaching the dicing die attachment layer to a surface of a semiconductor wafer; (c) cutting the semiconductor wafer into die units; (d) expanding the dicing die attachment film such that dies are more widely spaced apart from each other; (e) inserting a pin from the dicing film layer of the dicing die attachment film so as to bend the dicing die attachment film; and (f) picking up an individual die to which the die attachment layer is attached.

Preferably, in the step (f), the method may further include the step of mounting the picked-up die to a substrate.

In the step (f), after the mounting to the substrate, the method may further include the step of bonding the mounted die by applying a temperature of 100° C. to 250° C. and a pressure of 0.5 MPa to 5 MPa thereto.

BRIEF DESCRIPTION OF THE DRAWINGS

These and other features, aspects, and advantages of preferred embodiments of the present invention will be more fully described in the following detailed description, taken accompanying drawings. In the drawings.

REFERENCE NUMERALS OF ESSENTIAL PARTS IN THE DRAWINGS

100: dicing film layer 102: intermediate layer
103: die attachment layer 104: die

BEST MODE FOR CARRYING OUT THE INVENTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 4:
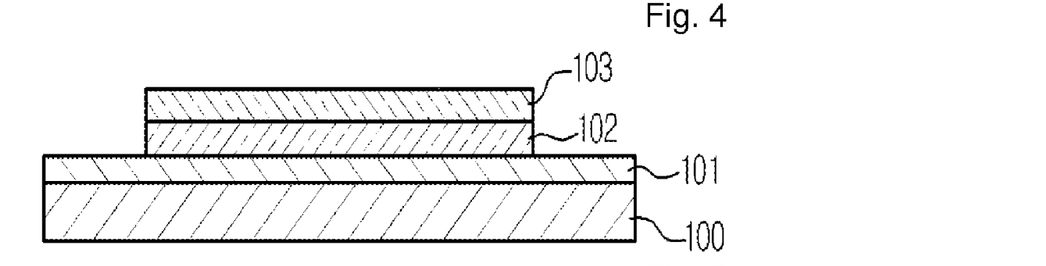
FIG. 4 is a sectional view showing a dicing die attachment film according to one embodiment of the present invention.
Figure 5:
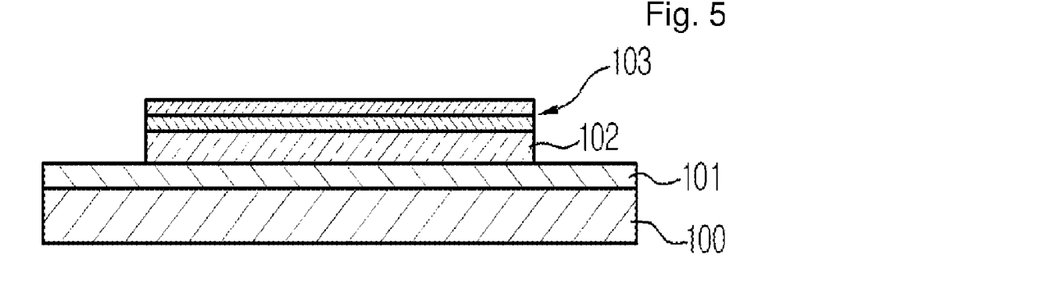
FIG. 5 is a sectional view showing a dicing die attachment film according to another embodiment of the present invention.

FIGS. 4 and 5 show a dicing die attachment film according to one embodiment of the present invention.

Referring to FIGS. 4 and 5, the dicing die attachment film according to one embodiment of the present invention includes a die attachment layer 103, a dicing film layer 100 and an intermediate layer 102. The dicing die attachment film shown in FIG. 5 is different from that of FIG. 4 in point that the die attachment layer 103 is configured in two layers.

The die attachment layer 103 is attached to a rear side of a semiconductor wafer, and it is configured in a single layer or multi layers. This die attachment layer 103 may be made of polyimide-based resin or epoxy-based resin.

The die attachment layer 103 is preferably configured to satisfy the standards regulated in JEDEC/IPC that is an international semiconductor standards organization.

In case the die attachment layer 103 is made of polyimide-based resin, its composition preferably includes precursor of polyimide resin as well as polyimide resin itself. The polyimide-based resin may be polyimide resin, polyisoimide resin, maleimide resin, bismaleimide resin, polyamide-imide resin, polyether-imide resin or polyimide-isoindro-quinazorindionimide resin. These resins may be used in single or in combination, and, in case of polyimide-based resin is used, a molecular weight of the polyimide-based resin is preferably 10,000 to 1,000,000, more preferably 50,000 to 100,000.

The epoxy-based resin may include at least one selected from the group consisting of solid or liquid epoxies such as bisphenol A-type epoxy, bisphenol F-type epoxy, tetrabromo-bisphenol A-type (TEP A-type) epoxy, hydrogenated-bisphenol A-type epoxy, novolak epoxy, multi functional epoxy, rubber-degenerated epoxy, thermoplastic epoxy, thermosetting epoxy, and water soluble epoxy, and its molecular weight is preferably 1 to 100,000.

The dicing film layer 100 is used for fixing a wafer and the die attachment layer 103 to a dicing die during the dicing process in which a semiconductor wafer is cut into die units, and the dicing film layer 100 is configured in a single layer or multi layers. Preferably, an adhesive layer 101 may be provided on an upper surface of the dicing film layer 100 so as to adhere the intermediate layer 102 thereto.

The dicing film layer 100 is preferably made of polyolefin-based (PO-based) resin. The PO resin may adopt low density polyethylene (LDPE), linear low density polyethylene (LLDPE), ethylene/propylene copolymer, polypropylene, polybutene, polybutadiene, polymethylpentene, ethylene/vinyl acetate copolymer, ethylene/methyl(meta)acrylic acid copolymer, ethylene/methyl(meta)acrylate copolymer, ethylene/ethyl(meta)acrylate copolymer, polyvinyl chloride, vinyl chloride/vinylacetate copolymer, ethylene/vinylchloride/vinyl acetate copolymer, polyurethane, polyamide, or ionomer, for example. Such extensible films may be used in combination. Furthermore, it is also possible to adopt a polymer film of a compound having carboxyl group as a unit polymer structure, or a laminate of this film and a general-purpose polymer film.

The intermediate layer 102 is laminated between the die attachment layer 103 and the dicing film layer 100, and gives an adhesive function controlling force to facilitate easy separation between the die attachment layer 103 and the dicing film layer 100 after dicing.

The intermediate layer 102 has an elastic modulus (hereinafter, referred to as 'modulus') greater than the die attachment layer 103 and the dicing film layer 100, and the modulus is about 100 to 3000 MPa. If the intermediate layer 102 has a modulus less than 100 MPa, it cannot attribute to decrease of burr generation. While, if the intermediate layer 102 has a modulus greater than 3000 MPa, a bending characteristic is bad during the picking-up process, thereby causing inferior picking-up.

Using the intermediate layer 102 having the above properties, it is possible to prevent the intermediate layer 102 from being elongated due to softening caused by grinding during the dicing process, and also to minimize the phenomenon that the adhesive on the dicing film layer 100 is mixed to the die attachment layer 103. In addition, since burr generated in the dicing film layer 100 may not easily move to the die attachment layer 103 through the intermediate layer 102 having a great modulus, the intermediate layer 102 may advantageously decrease burr generation in the entire dicing die attachment film.

The intermediate layer 102 preferably has a change rate of a storage modulus, calculated by dividing a storage modulus at 120° C. by a storage modulus at 25° C., which is 0.001 to 1. If the change rate of storage modulus is less than 0.001, in case a temperature raises during the dicing process, the raised temperature may cause deformation of the intermediate layer 102 or mixing between the die attachment layer 103 and the dicing film layer 100, thereby resulting in more burr generation.

The intermediate layer 102 preferably has an elongation of 10 to 700%. If the elongation is less than 10%, the intermediate layer 102 is not easily expanded during the picking-up process. While, if the elongation exceeds 700%, burr generation is caused.

In addition, the intermediate layer 102 preferably has a thickness of 5 to 100 µm If the intermediate layer 102 has a thickness less than 5 µm, it hardly contributes to decrease of burr generation, and it is also not easy to control the degree of cutting in the dicing process, during which the intermediate layer 102 is only partially cut. If the intermediate layer 102 has a thickness greater than 100 μm, a dicing blade is more worn away, thereby causing any problem in bending of the film during the picking-up process.

An adhesive force between the die attachment layer 103 and the intermediate layer 102 is preferably smaller than an adhesive force between the intermediate layer 102 and the dicing film layer 100 such that the picking-up process may be more easily conducted without remaining any residue on the interface between the intermediate layer 102 and the die attachment layer 103. An adhesive force between the die attachment layer 103 and the intermediate layer 102 is preferably ranged from 2 gf/in to 100 gf/in such that the adhesive force is kept in a degree capable of preventing penetration of impurities between the die attachment layer 103 and the intermediate layer 102, preventing die flying phenomenon, and holding the die and the die attachment layer 103 during the dicing process.

The adhesive force between the die attachment layer 103 and the intermediate layer 102 may be controlled by adjusting properties of the die attachment layer 103 or by means of release treatment for the interface of the intermediate layer 102 that contacts with the die attachment layer 103. A release agent used for the release treatment may adopt silicon-based, fluorine-based, unsaturated ester-based, polyolefin-based, or wax-based agent, and among them, a silicon-based or fluorine-based release agent is most preferred.

Meanwhile, an adhesive force of the interface between the intermediate layer 102 and the dicing film layer 100 is preferably 100 gf/in or above. If the adhesive force is less than 100 gf/in, the intermediate layer 102 and the dicing film layer 100 may be separated due to several expansions, and also the picking-up characteristic is deteriorated.

The intermediate layer 102 is preferably made of polyethylene terephthalate (PET) or polyethylene-2,6-naphthaledicarboxylate (PEN). As an alternative, the intermediate layer 102 may also be made of polyethylene resin such as HDPE/LDPE, polypropylene resin, polyvinylchloride resin (PVC), fluoric resin, polybutyleneterephthalate resin, polyetherimide resin, polysulfone resin, polyethersulfone resin (PES), cellulose resin, polyimide resin, polyester resin, polyether resin, polyetherketone resin, polyetheretherketone resin, epoxy resin, phenol resin, polyamide resin, polyoxymethylene resin, polyphenylene sulfide resin, and so on.

The adhesive layer 101 provided on the dicing film layer 100 is used for adhering the intermediate layer 102, and it functions to fix a wafer and the die attachment layer 103 to the dicing film layer 100 during the dicing process, and also to fix the intermediate layer 102 not to be separated during the die picking-up process. This adhesive layer 101 may be made of well-known acryl, silicon, vinyl, polyurethane, or polyester adhesive.

Figure 6:
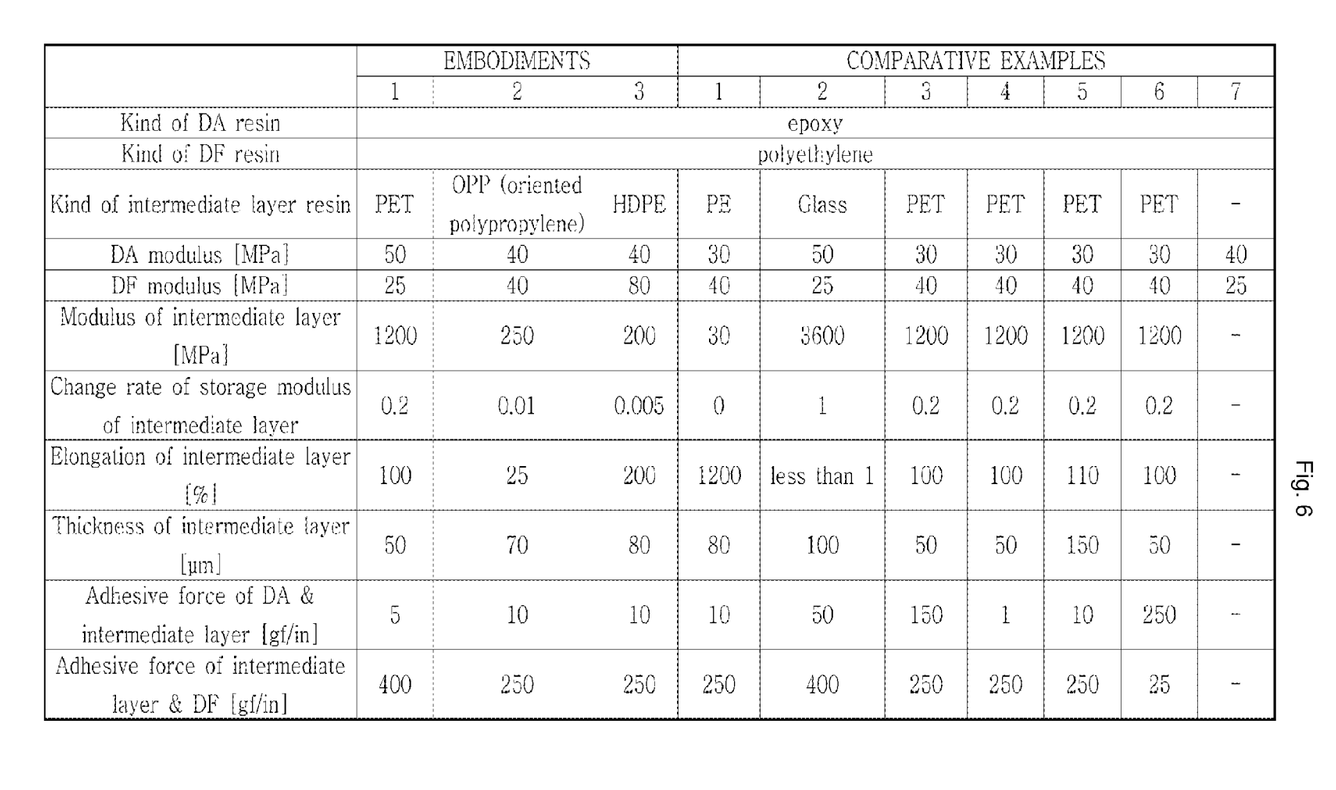
FIG. 6 is a table showing properties and materials of each component of dicing die attachment films according to embodiments and comparative examples.
Figure 7:
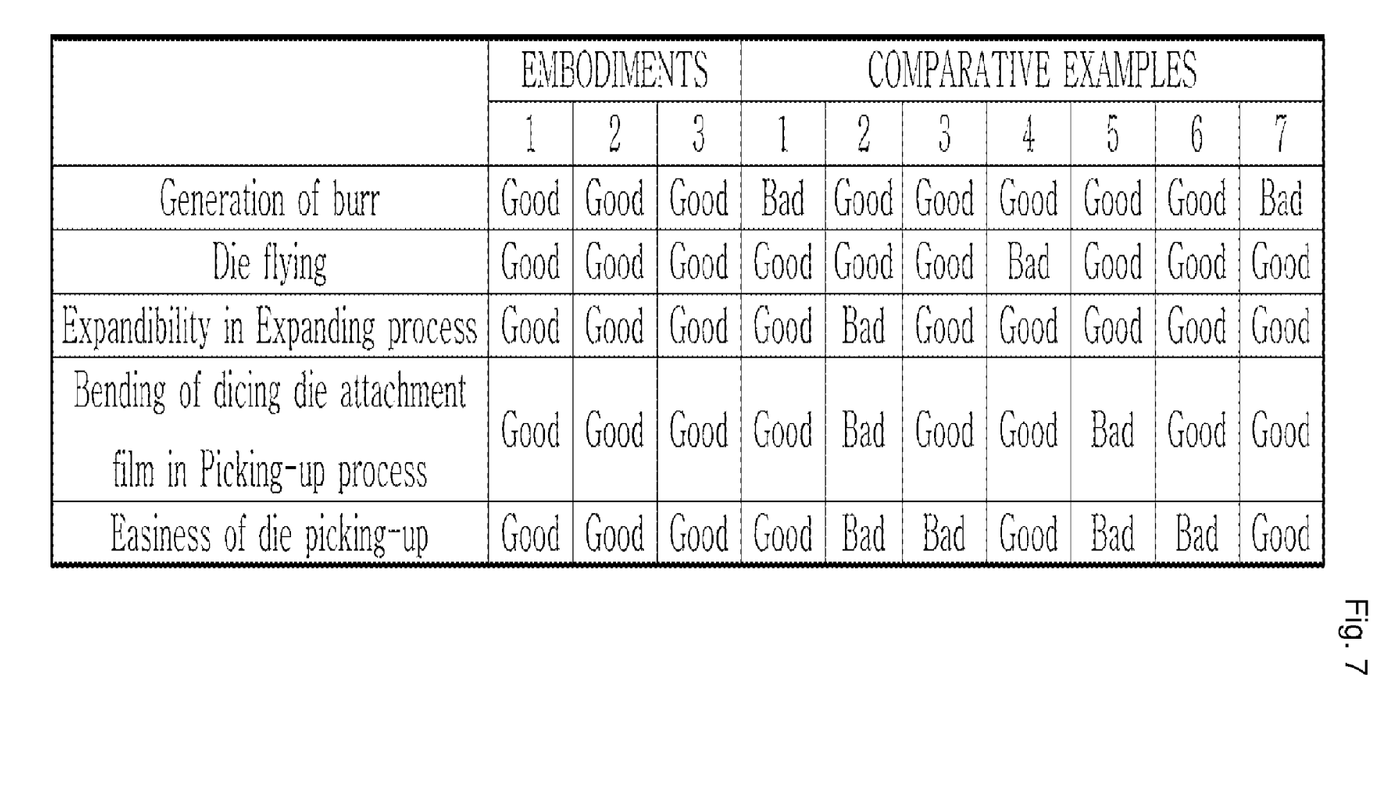
FIG. 7 is a table showing evaluation results of the embodiments and the comparative examples of FIG. 6.
Figure 8:
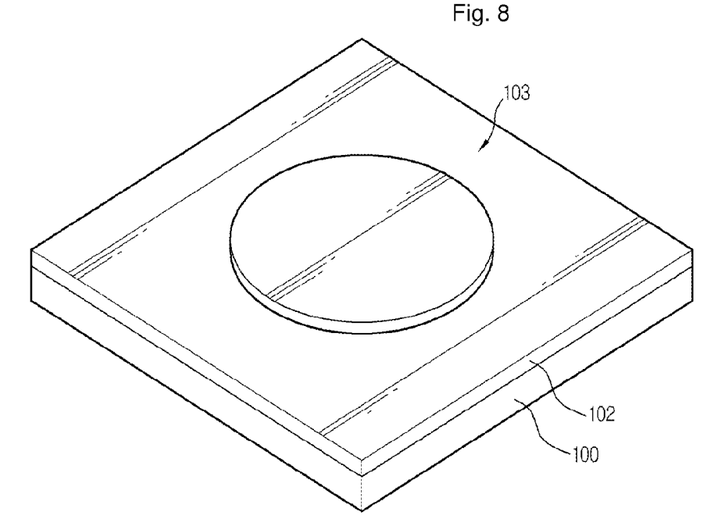
FIGS. 8 to 14 illustrate processes for executing a semiconductor packaging method according to a preferred embodiment of the present invention.

FIGS. 6 and 7 show evaluation results for properties and materials of each component of the dicing die attachment film according to embodiments and comparative examples.

Referring to FIG. 6, a method for manufacturing a dicing die attachment film having a three-layered structure according to embodiments 1 to 3 and comparative examples 1 to 6 will be explained.

PET was used for a protective layer, and a corresponding resin was coated on one surface of the protective layer to make a die attachment layer in a film shape (hereinafter, referred to as 'a die attachment film (DA)'). In the coating process, a linear speed and a discharge rate of a coater were controlled to adjust a thickness of the die attachment film (DA). At this time, an interval between pads on which the die attachment film (DA) is placed should be controlled uniformly such that the coated die attachment film (DA) has a constant coating thickness in a width direction.

After coating, the die attachment film (DA) configured a film shape by a heating process, and after the heating process was completed, a UV curing process was performed such that the die attachment film (DA) was kept in a B-stage state, not in a completely-cured state. Here, the term 'B-stage state' is defined that a thermosetting resin is softened due to heating over an A-stage state of an initial reaction step but not melted, and also swelled by solvent but not dissolved. Thus, a reaction state may be controlled by adjusting an amount of irradiated UV.

After that, an intermediate layer having properties and resin of the embodiments was prepared. The intermediate layer was controlled such that its attachment surface with the die attachment film (DA) had an adhesive force proposed in the embodiments by means of a release treatment.

Finally, an adhesive layer of a dicing film (DF) was attached to the other surface of the intermediate layer so that the intermediate layer and the dicing film (DF) were laminated.

In FIG. 6, the dicing die attachment film having a two-layered structure according to the comparative example 7 was manufactured in a way that a corresponding resin was coated on one surface of a PET protective layer to make a die attachment film (DA), UV was irradiated thereto, and then an adhesive layer of a dicing film (DF) was directly attached to the die attachment film (DA) to laminate the die attachment film (DA) and the dicing film (DF).

In FIG. 7, a method for measuring generation of burr is conducted as follows. That is, a WBL (Wafer Back Lamination) process was used to laminate a die attachment film (DA) and a wafer, and then, after a dicing process was conducted, burr of the die adhesive coming out from the top of the wafer was firstly checked by the naked eye using a microscope. Then, after the die attachment process, burr of the die adhesive coming out aside or above the die from the edge of the die was secondly checked by the naked eye using a microscope.

In the burr generation measurement, it was determined acceptable if the burr was shorter than the thickness of wafer or the burr did not cover a wire bonding pad during the second checking. If a tape burr rode on the wire bonding pad formed on the die, it might cause any inferiority during a wire bonding process, which is followed by the die attachment process.

In FIG. 7, a method for measuring burr generation is conducted as follows. That is, since it is important to check whether burr generated during the dicing process after die attachment covers the wire bonding pad, the burr adhered to the wire bonding pad is marked as inferior during the second naked-eye checking process. In addition, before the second naked-eye checking process, the first naked-eye checking process is conducted to check whether burr rides on a wafer from the position through which a blade passes after the dicing process, and then it is determined to have inferiority if much burr is generated. Here, a measurement unit is PPM, and it is finally determined to have no inferiority if burr does not cover a wire bonding pad after the die attachment process, but it is required in advance that burr does not ride on the wafer in the first naked-eye checking process.

In FIG. 7, for the measurement related to die flying, a die attachment film (DA) and a wafer were laminated using the WBL process, and after that, it was checked whether the die is separated during the dicing process. Here, it was determined successful if no die flying exists.

In FIG. 7, for the measurement related to expansibility during an expanding process, the expanding process was conducted during the die attachment process, and at this time, it was checked whether dies were separated well so that a die did not collide with an adjacent die during the die picking-up process. Here, it was determined successful if dies were not collided with each other.

In FIG. 7, a method for measuring a bending property of a dicing die attachment film during the expanding process is conducted as follows. That is, a die is picked up during the die attachment process, and at this time, an eject pin is inserted so as to pick the die to a predetermined height. At this time, when picking up the die, the eject pin holds a smaller area than the size of the die, so a mount tape and a die attachment film (DA) may be separated differently at an edge portion of the die depending on the bending property of the dicing film (DF). During the picking-up process, the picking-up property is better when the separation is greater, so a better bending property is required. Here, it is determined successful if no inferiority exists during the picking-up process.

In FIG. 7, for the measurement related to easiness of die picking-up, it was checked whether a die and a die attachment film (DA) were well separated from a dicing film (DF) during the die attachment process, after the dicing process. Here, during the die picking-up process, it was determined unsuccessful if only the die was picked up but the die attachment film (DA) was not picked up, if both die and die attachment film (DA) were not picked up, or if the die and the die attachment film (DA) were all picked up but the die and the die attachment film (DA) were separated.

Figure 11:
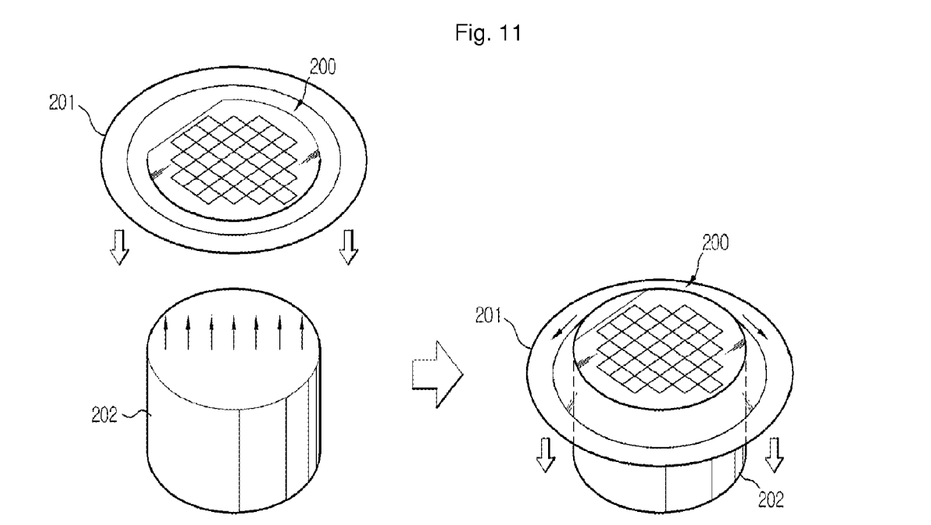
Figure 12:
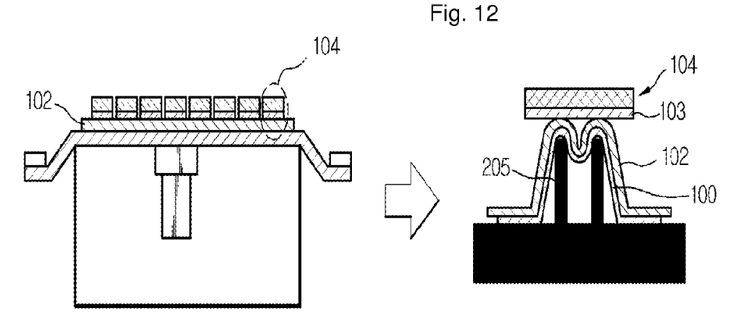
Figure 13:
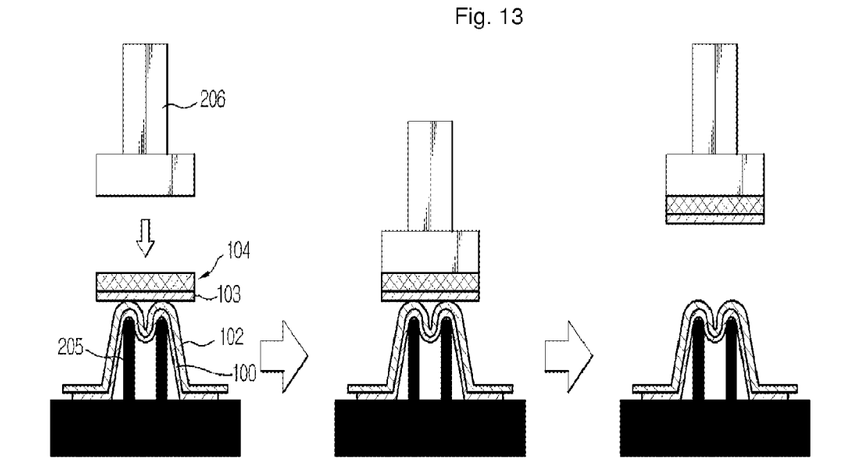

FIGS. 8 to 14 illustrate a method for packing a semiconductor according to a preferred embodiment of the present invention. As shown in FIGS. 8 to 14, the semiconductor packaging method according to a preferred embodiment of the present invention includes preparing a dicing die attachment film configured as shown in FIG. 4 (FIG. 8); attaching the dicing die attachment film to a surface of a wafer 200 (FIG. 9); dicing the wafer 200 using a dicing blade 300 (FIG. 10); expanding the dicing die attachment film (FIG. 11); inserting an eject pin 205 from a dicing film layer 100 of the dicing die attachment film to bend the dicing die attachment film (FIG. 12); and picking up a die 104 using a suction tool 206 (FIG. 13).

Figure 9:
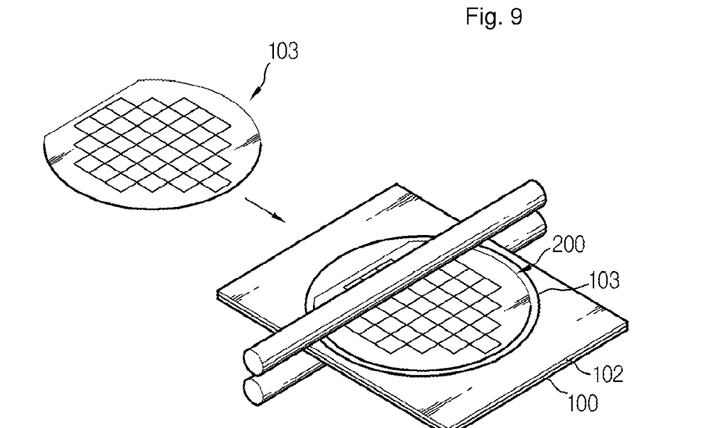

In the attachment process of FIG. 9, the semiconductor wafer 200 and the dicing die attachment film are attached to each other using a lamination roller, and it is conducted under the condition of a temperature of 40° C. to 150° C. and a pressure of 1 to 10 kg/cm² so as to ensure a sufficient adhesive force between the wafer 200 and the dicing die attachment film. More preferably, the temperature and pressure conditions of this attachment process are set as 60° C. to 120° C. and 1 to 4 kg/cm².

Figure 10:
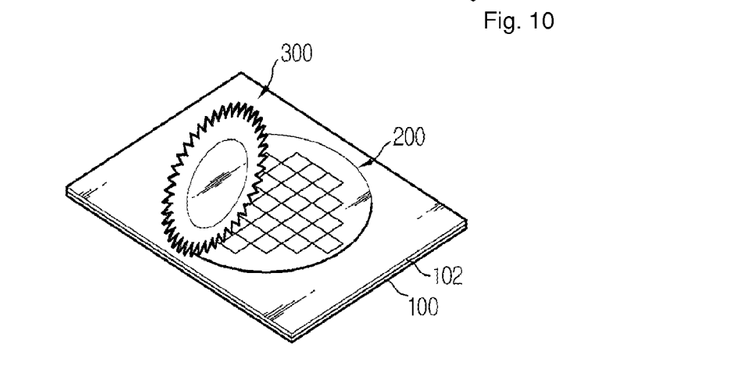

The dicing process of FIG. 10 is to cut the wafer into individual dies, and a dicing depth may be changed depending on thickness of a wafer, thickness of the die attachment layer 103 and the dicing film layer 100, rpm or linear speed of the dicing blade 300, and so on. The dicing die attachment film is preferably cut such that the intermediate layer is partially or entirely cut so as to minimize burr that may be generated during the dicing process.

In the expanding process of FIG. 11, after the dicing process, an inside of the dicing die attachment film having a tape shape attached to a SUS-ring 201 is raised up to a predetermined height by means of a circular jig 202, and then the dicing die attachment film supporting a diced wafer is pulled in both side directions, so as to facilitate easier die picking-up during the die attachment process. In this way, dies may be more widely spaced apart from each other rather than the case just after the dicing process. In addition, it is possible to minimize interference between dies when the eject pin 205 moves up, and also a certain tension is applied to the dicing die attachment film so that the dicing die attachment film may be well separated at an edge portion of the wafer 200.

In the bending process of FIG. 12, during the die picking-up process, the eject pin 205 having a smaller size than the die 104 moves up from a lower position of the dicing die attachment film to push the die 104 upward, and at this time the intermediate layer 102 and the die attachment layer 103 are separated at an edge of the die 104. Thus, during the die picking-up process shown in FIG. 13, the die 104 and the dicing film layer 100 may be separated easily. The bending process is influenced by a bending property of the dicing die attachment film, and a suitable bending property may be ensured only when the above-mentioned modulus conditions of the intermediate layer are satisfied.

Figure 14:
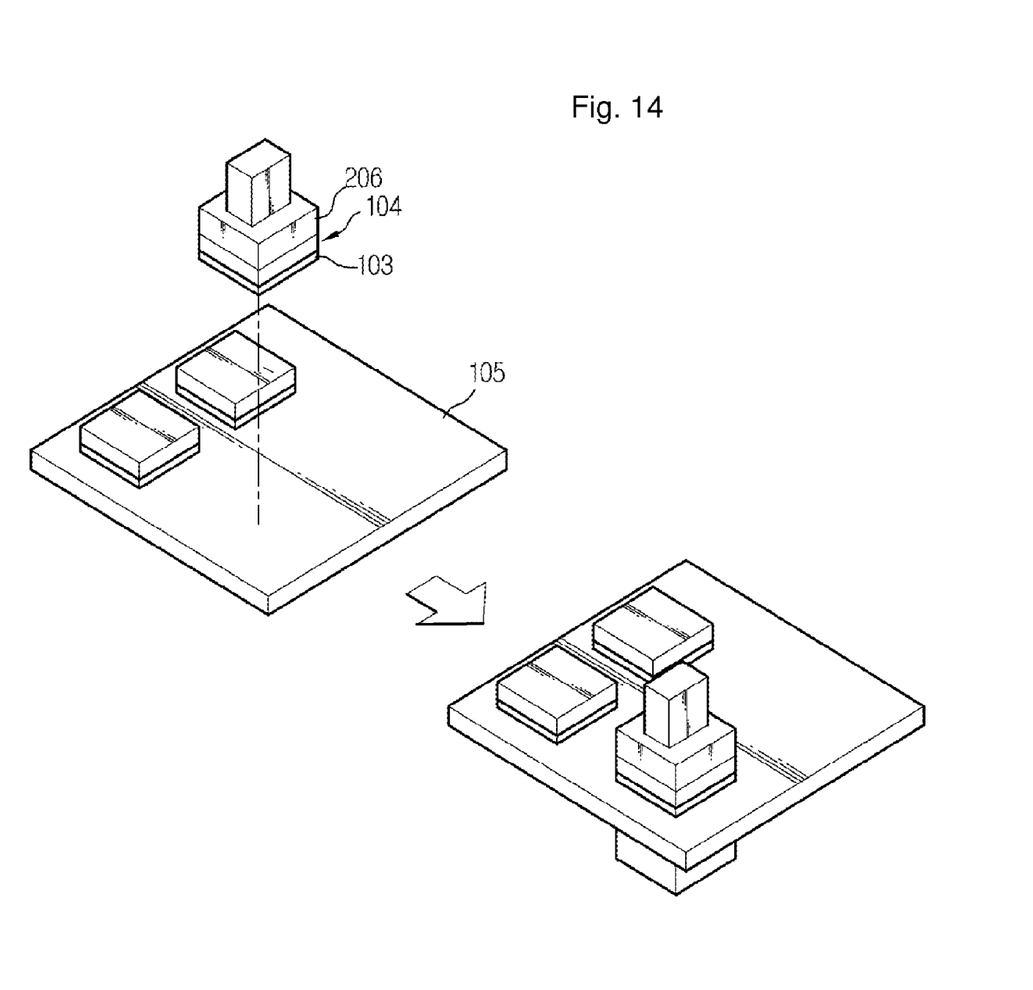

Meanwhile, after the die picking-up process, a process of mounting the die 104, to which the die attachment layer 103 is attached, to a substrate 105 is further performed. Here, a lead frame or a semiconductor chip may be selected as an equivalent of the substrate 105.

After the mounting to the substrate 105, a process of applying a temperature in the range of 100° C. to 250° C. and a pressure in the range of 0.5 MPa to 5 MPa is performed. Here, if the temperature is lower than 100° C., an adhesive force may be lowered. Meanwhile, if the temperature is higher than 250° C., the die attachment layer 103 may be seriously deformed due to the high temperature. In addition, if the pressure is lower than 0.5 MPa, it is impossible to give a sufficient pressure such that the die attachment layer 103 with a predetermined adhesive force is adhered onto a substrate. Meanwhile, if the pressure is higher than 5 MPa, a circuit pattern formed on the die 104 may be damaged. The time taken for applying a pressure is preferably 0.5 to 5 seconds.

After the die bonding process is completed, a wire is connected and then a molding resin is used for molding, thereby making a semiconductor package.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

INDUSTRIAL APPLICABILITY

According to the present invention, it is possible to prevent generation of burr and die flying during the dicing process, and also the die attachment layer and the dicing film layer may be easily separated during the picking-up process.

The invention claimed is:
1. A dicing die attachment film, comprising:
   a die attachment layer attached to one surface of a semiconductor wafer;
   a dicing film layer attached to a dicing die that is used for cutting the semiconductor wafer into die units; and
   an intermediate layer laminated between the die attachment layer and the dicing film layer, wherein the intermediate layer has a modulus of 100 to 3000 MPa, which is greater than a modulus of the die attachment layer and the dicing film layer.
2. The dicing die attachment film according to claim 1, wherein a change rate of a storage modulus of the intermediate layer (a storage modulus at 120° C./a storage modulus at 25° C.) is 0.001 to 1.

3. The dicing die attachment film according to claim 1, wherein the intermediate layer has an elongation of 10 to 700%.

4. The dicing die attachment film according to claim 1, wherein the intermediate layer has a thickness of 5 to 100 μm.

5. The dicing die attachment film according to claim 1, wherein an adhesive force between the die attachment layer and the intermediate layer is lower than an adhesive force between the intermediate layer and the dicing film layer.

6. The dicing die attachment film according to claim 1, wherein an adhesive force between the die attachment layer and the intermediate layer is 2 gf/in to 100 gf/in.

7. The dicing die attachment film according to claim 1, wherein the intermediate layer is made of polyethylene terephthalate (PET) or polyethylene-2,6-naphthaledicarboxylate (PEN).

8. The dicing die attachment film according to claim 1, further comprising an adhesive layer provided between the intermediate layer and the dicing film layer.

9. The dicing die attachment film according to claim 1, wherein the die attachment layer is made of polyimide-based resin or epoxy-based resin.

10. The dicing die attachment film according to claim 1, wherein the dicing film layer is made of polyolefin-based resin.

11. A method for packaging a semiconductor, comprising:
(a) preparing a dicing die attachment film that includes a die attachment layer attached to one surface of a semiconductor wafer, a dicing film layer attached to a dicing die that is used for cutting the semiconductor wafer into die units, and an intermediate layer laminated between the die attachment layer and the dicing film layer, the intermediate layer having a modulus of 100 to 3000 MPa, which is greater than a modulus of the die attachment layer and the dicing film layer;
(b) attaching the dicing die attachment layer to a surface of a semiconductor wafer;
(c) cutting the semiconductor wafer into die units;
(d) expanding the dicing die attachment film such that dies are more widely spaced apart from each other;
(e) inserting a pin from the dicing film layer of the dicing die attachment film so as to bend the dicing die attachment film; and
(f) picking up an individual die to which the die attachment layer is attached.

12. The method for packaging a semiconductor according to claim 11, further comprising: mounting the picked-up die to a substrate.

13. The method for packaging a semiconductor according to claim 12, after the mounting of the picked-up die to the substrate, further comprising:
bonding the mounted die by applying a temperature of 100° C. to 250° C. and a pressure of 0.5 MPa to 5 MPa thereto.

14. The dicing die attachment film according to claim 5, wherein an adhesive force between the die attachment layer and the intermediate layer is 2 gf/in to 100 gf/in.

* * * * *